United States Patent [19]

Fasching

[11] 4,011,463
[45] Mar. 8, 1977

[54] HIGH VOLTAGE PULSE GENERATOR

[75] Inventor: George E. Fasching, Morgantown, W. Va.

[73] Assignee: The United States of America as represented by the United States Energy Research and Development Administration, Washington, D.C.

[22] Filed: June 12, 1975

[21] Appl. No.: 586,460

[52] U.S. Cl. .............................. 307/110; 307/108
[51] Int. Cl.² ..................... H02M 7/12; H03K 3/72
[58] Field of Search .................. 307/110, 109, 108; 320/1

[56] References Cited

UNITED STATES PATENTS

| | | | |
|---|---|---|---|
| 3,111,594 | 11/1963 | Stolte | 307/110 |
| 3,229,124 | 1/1966 | Schofield | 307/110 |

*Primary Examiner*—Stuart N. Hecker
*Attorney, Agent, or Firm*—Dean E. Carlson; David S. Zachry; David E. Breeden

[57] ABSTRACT

An improved high-voltage pulse generator has been provided which is especially useful in ultrasonic testing of rock core samples. An N number of capacitors are charged in parallel to V volts and at the proper instance are coupled in series to produce a high-voltage pulse of N times V volts. Rapid switching of the capacitors from the paralleled charging configuration to the series discharging configuration is accomplished by using silicon-controlled rectifiers which are chain self-triggered following the initial triggering of a first one of the rectifiers connected between the first and second of the plurality of charging capacitors. A timing and triggering circuit is provided to properly synchronize triggering pulses to the first SCR at a time when the charging voltage is not being applied to the parallel-connected charging capacitors. Alternate circuits are provided for controlling the application of the charging voltage from a charging circuit to be applied to the parallel capacitors which provides a selection of at least two different intervals in which the charging voltage is turned "off" to allow the SCR's connecting the capacitors in series to turn "off" before recharging begins. The high-voltage pulse-generating circuit including the N capacitors and corresponding SCR's which connect the capacitors in series when triggered "on" further includes diodes and series-connected inductors between the parallel-connected charging capacitors which allow sufficiently fast charging of the capacitors for a high pulse repetition rate and yet allow considerable control of the decay time of the high-voltage pulses from the pulse-generating circuit.

3 Claims, 4 Drawing Figures

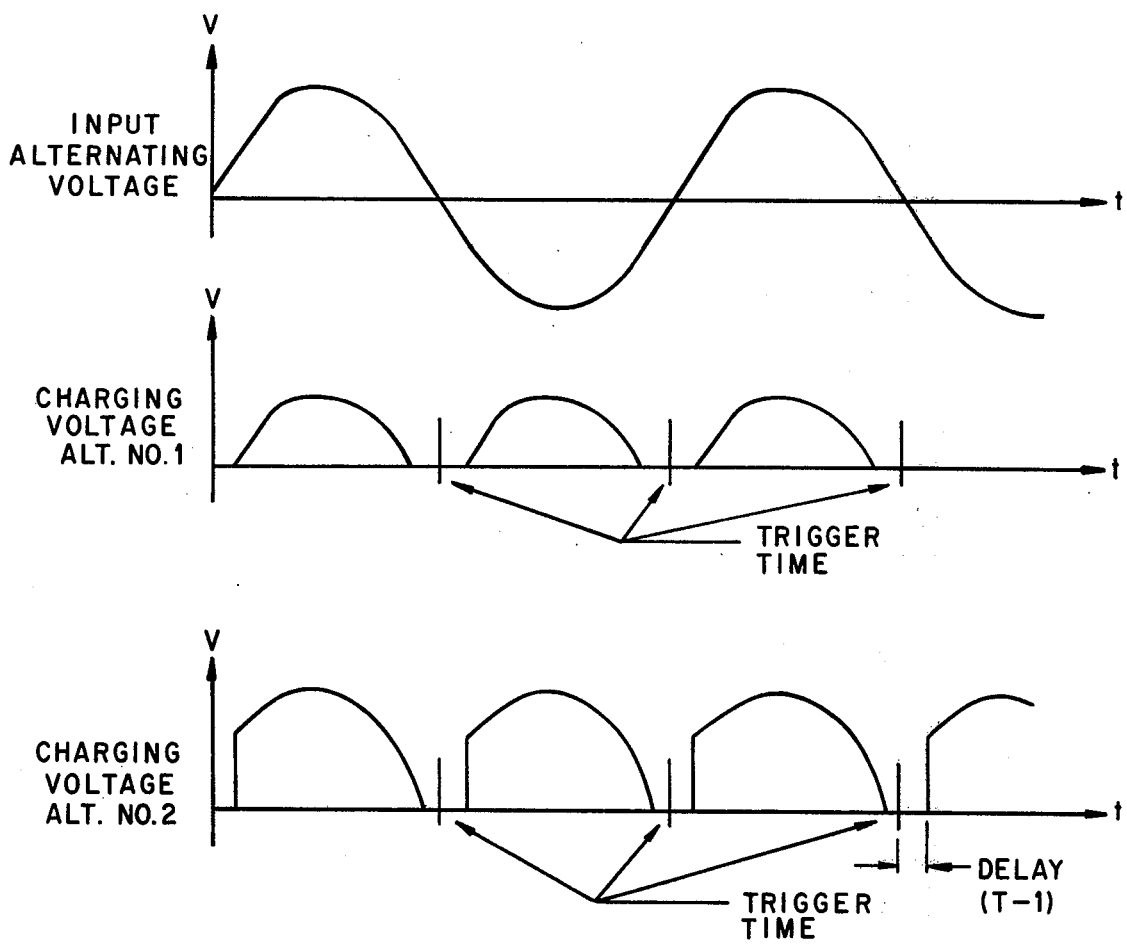

HIGH VOLTAGE PULSE GENERATOR

BACKGROUND OF THE INVENTION

This invention relates generally to pulse-generating circuits and more specifically to high-voltage pulse-generating circuits in which high voltages are achieved by initially charging N number of capacitors in parallel and discharging the capacitors in series.

In the art of high-voltage pulse generators it has generally been the case to use a single capacitor which is charged to a specific voltage which is then transferred to a transformer secondary, multiplied by the transformer turns ratio. These circuits require a high-voltage transformer which is not only expensive, but increases the rise time of the high voltage output pulse due to the inherent induction of the transformer itself.

In view of the deficiencies in transformer output pulse generators, it has been the practice to charge capacitors in parallel and at the proper instance coupling in series to produce a high-voltage pulse which is the output of the circuit. Problems arise in switching from the charging mode where the capacitors are connected in parallel to the discharge mode where the capacitors are connected in series to produce the high-voltage pulse. As high repetition rates are required for the high-voltage output, the switching from the parallel to the series mode becomes increasingly critical. The output pulse rise time must be fast and the period in which the capacitors are charged must be fast also and properly coordinated to provide an efficient high-voltage pulse generator which can be operated at relatively high-pulse repetition rates.

SUMMARY OF THE INVENTION

In view of the above, it is an object of this invention to provide a high-voltage pulse generator of the type wherein N capacitors are charged in parallel and subsequently switched to discharge in series to produce the high-voltage pulse that may be operated at very high-pulse repetition rates with increased efficiency.

Another object of this invention is to provide a high-voltage pulse generator as in the above object wherein silicon-controlled rectifiers are employed to rapidly switch the capacitors from the parallel to a series connection to generate fast rise time output pulses.

Yet another object of this invention is to provide a high-voltage pulse generator as set forth in the above objects in which the charging current applied to the capacitors while in the parallel charging mode is held inactive during the time said capacitors are switched to the series discharge mode to facilitate fast discharging and return to the parallel charging mode.

An additional object of this invention is to provide a high-voltage pulse generator as set forth in the above objects in which the output pulse amplitude and repetition rate may be conveniently selected.

Other objects and many of the attendant advantages of the present invention will be obvious from the following detailed description taken in conjunction with the drawings

BRIEF DESCRIPTION OF THE DRAWINGS

FIG. 3 is a plot of the input voltage and alternate charging voltage wave forms for a selected high-voltage pulse rate of 120 pulses per second.

DETAILED DESCRIPTION

Figure 1:
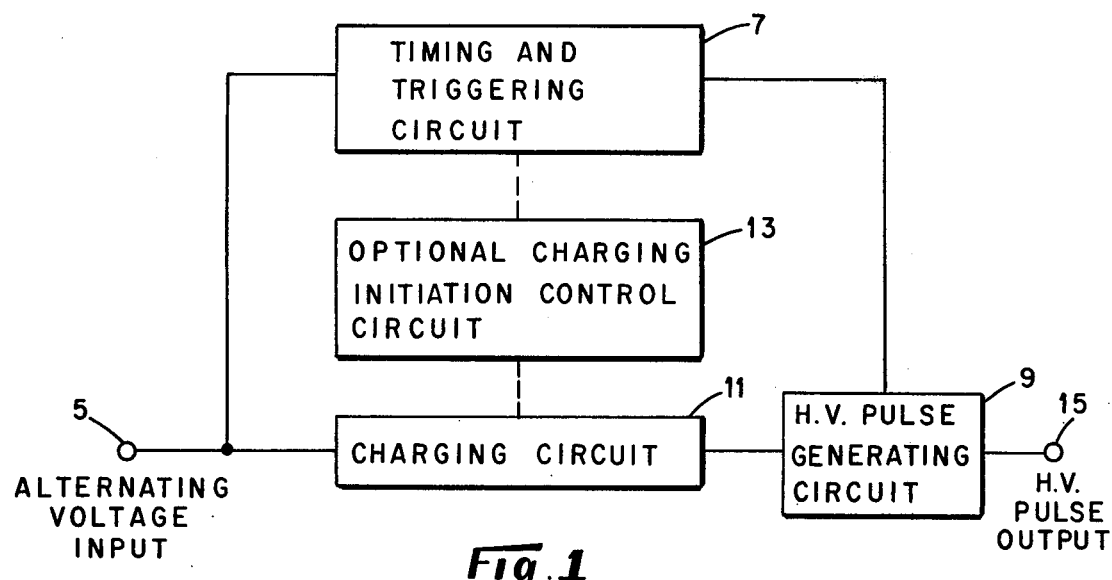
FIG. 1 is a block diagram of a high-voltage pulse generator according to the present invention.

Referring now to FIG. 1 wherein there is shown a block diagram of the high-voltage pulse generator which consists essentially of four basic circuits, a timing and triggering circuit 7 is connected to receive the alternating voltage input at 5. The circuit 7 generates the trigger signal which initiates the generation of a high voltage (H.V.) pulse output and controls the pulse repetition rate as will be described hereinbelow. The output of the timing and triggering circuit 7 is connected to the control input of a high-voltage, pulse-generating circuit 9. A charging circuit 11 is connected to receive the same alternating voltage input at 5 and functions to deliver a charge to the H.V. generating circuit 9 at the appropriate time based on the frequency and phase of the alternating voltage input 5. The timing for the initiation of charging is normally fixed referenced to the phase of the input alternating voltage. However, the optional charging initiation control circuit 13 may be used to set the phase timing for the start of charging of parallel-connected capacitors in the H.V. pulse-generating circuit 9.

The high-voltage pulse-generating circuit 9 includes a plurality of N capacitors which are charged to a selected voltage V via the charging circuit 11. The capacitors which are charged in a parallel configuration are then discharged in a series configuration to produce a high voltage pulse output at 15 which has a peak height N times V. The optional charging initiation control circuit 13 is provided to facilitate an alternate method for controlling the charging time start point as will be described hereinbelow.

Figure 2:
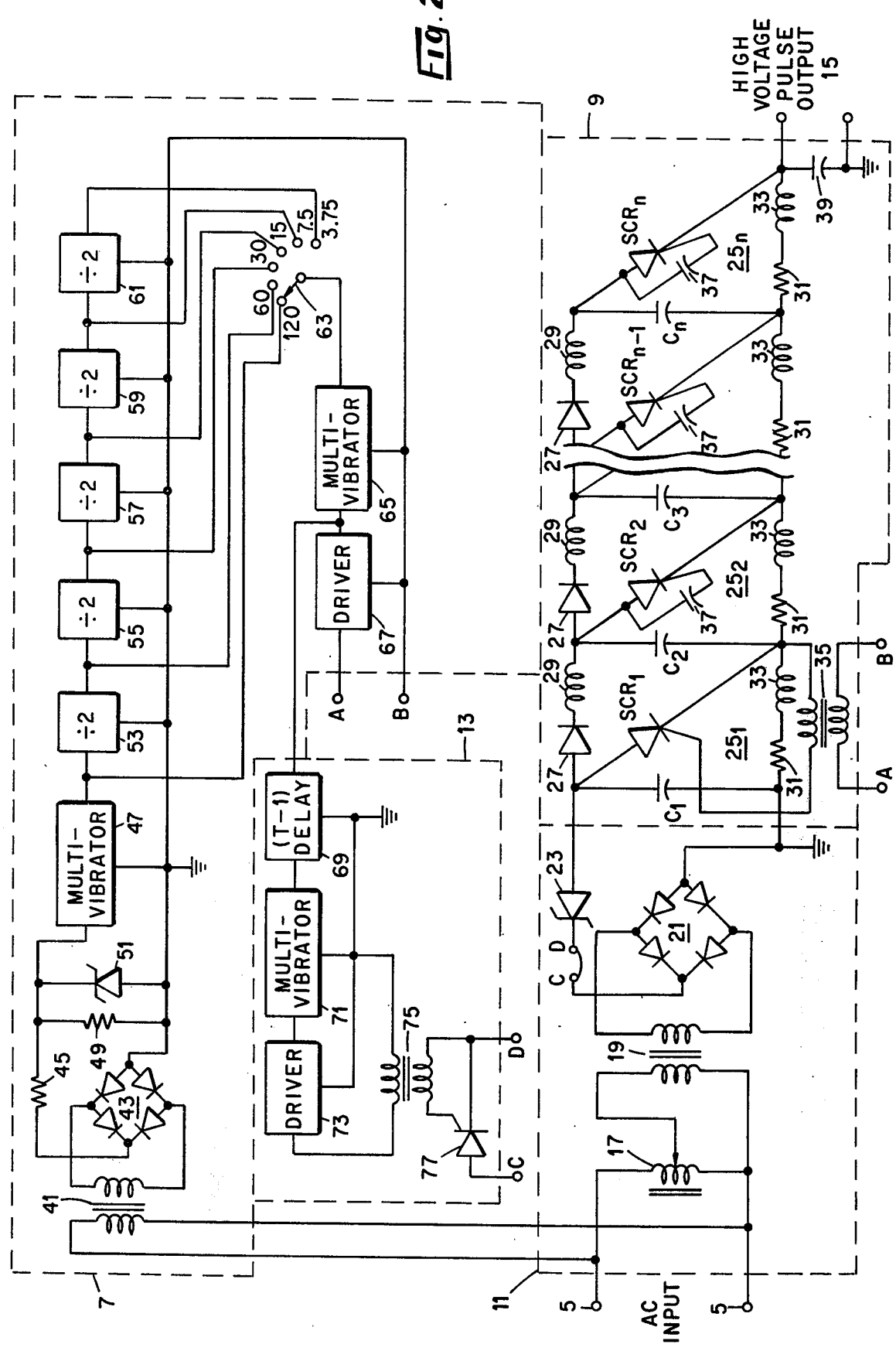
FIG. 2 is a detailed schematic diagram of the pulse generator shown in FIG. 1.

Referring now to FIG. 2 wherein the identical parts shown in block form in FIG. 1 are outlined by dashed enclosures of identical numbers, it will be seen that the alternating voltage input 5 is connected across an autotransformer winding 17 which has its adjustable tap connected to the primary of a transformer 19 of the charging circuit 11. The output voltage of charging circuit 11 is selected by means of adjusting the output of autotransformer 17. The secondary of transformer T2 is connected to the input of a full wave bridge rectifier 21. The charging voltage available at the output of bridge 21 provides a limited rectifier voltage level that will not exceed the breakdown voltage level of the SCR's and the capacitors C in the pulse-generating circuit 9. Thus, the output of full wave bridge rectifier 21 is connected through a zener diode 23 to the input of the pulse-generating circuit 9. The frequency of the alternating voltage input may be line frequency (60 Hz) or any frequency between near zero to an upper frequency limited only by the charging rate of capacitors C in the pulse-generating circuit 9. The alternating wave form is not restricted to a sine wave but can be a square, pulse, triangular, etc.

In charging circuit 11, the pulse output voltage is controlled by the selected output of variable autotransformer 17. Transformer 19 provides isolation for the pulse-charging circuit 11 and the pulse-generating circuit 9. It will be understood that if necessary, transformer 19 may also transform the input level to a higher value by using a turns ratio greater than 1. The diode bridge 21 full wave rectifies the secondary voltage from the transformer 19. No charging current must be applied to the pulse-generating circuit 9 during the production of an H.V. pulse which begins at the time a trigger is received from the timing and triggering circuit 7 and is not complete until the output at 15 decays to a very low level and all of the SCR's of the generating circuit 9 have been allowed to turn "off." The zener diode 23 prevents any charging current for this time period, as shown in FIG. 3 (charging voltage alternate 1). The zener diode 23 clips the lower portion of the bridge output wave form and clamps the remaining portion to the zero base line, as shown in FIG. 3. Specifically, the voltage loss due to the zener diode 23 is between 20 and 50 volts.

The pulse-generating circuit 9 consists of N cascaded networks (25, $25_n$), each including one of the charge storage capacitors $C_1$ through $C_n$. Each network includes a diode 27 which has its anode connected to the ungrounded side of the respective charge storage capacitor for the particular network 25. The anode of diode 27 of the first network is also connected to the anode of zener diode 23. Each network has an inductor 29 connected in series with the corresponding diode 27. The inductors 29 are connected between the cathode of the respective diode 27 and the anode of the diode 27 for the next charging network connected in cascade. Following the first network (25) the charging capacitor for the succeeding network is connected to the common connection between inductor 29 and anode of the diode 27 for the particular network. The charging capacitor $C_1$ for the first network has one terminal tied directly to ground and each succeeding charging capacitor ($C_2$-$C_n$) is tied to the ground side of the circuit through series-connected resistor 31 and inductor 33 circuits. The SCR's ($SCR_1$-$SCR_n$) are connected between the positively charged side of the respective network charging capacitor and the ground side of the succeeding network charging capacitor. The anodes of the SCR's are connected to the positively charged sides of the respective charging capacitors. In the first network (25) the gate for $SCR_1$ is connected through the secondary of a pulse transformer 35 to the cathode. The remaining SCR's ($SCR_2$-$SCR_n$) have capacitors 37 connected between their anodes and gate electrodes.

The turning "on" of the first SCR starts a chain reaction which instantly triggers "on" all the other SCR's. $SCR_1$ is triggered by a pulse from the timing and triggering circuit 7 to the primary of pulse transformer 35. Once $SCR_1$ is triggered "on" each SCR in succession receives a rapid pulse rise at the gate transmitted by capacitors 37 which are chosen sufficiently large to cause an increase in voltage across the SCR's not yet turned "on" to produce a current into the gates of these SCR's in succession, turning the SCR's "on" in a chain reaction manner. The end result is a series connection of the charged capacitors $C_1$ through $C_n$ such that the voltage of the charged capacitors add to yield a combined output voltage at 15 of approximately NV (N times V), where N is the number of capacitors (C) and V is the voltage to which each capacitor (C) is charged. The circuit design and component values may be chosen such that all capacitors are charged to the same voltage. Identical voltages, however, are not necessary.

The voltage (V) to which each storage capacitor is charged is approximately the peak value of the secondary voltage of the transformer 19 less the drop across the zener diode 23. The voltage buildup on capacitors $C_1$ through $C_n$ essentially follows the charging voltage since the resistance 31 and inductors 29 and 33 offer low impedace (R = 30 ohms and inductors 29 and 33 approximately 100 microhenries) and diodes 27 cause only 0.7 volt drop each. A large number of capacitors may be charged in this manner and when the SCR's are triggered, they are reconnected to a series configuration by the switching action of the SCR's. This results in the voltage N times V developed at the high voltage output 15.

The inductors 29 and diodes 27 sustain the charge-storing capacitors C voltage for the duration of the generated pulse at 15. The combination of these two elements controls the discharge of capacitors C through the associated SCR's which are conducting during the pulse generation time. Each capacitor C is coupled into a loop with an inductor 33 and resistor 31 that is completed by a turned "on" SCR during the time a high voltage pulse appears at 15. The decay of the output pulse depends upon the damping factor of the loop described above which for each loop is $$d.f. = \frac{R_{31}}{2} \sqrt{\frac{C}{L_{33}}}$$

The decay of the high voltage output pulse may be adjusted by varying the damping factor of each loop. The rise time of the high voltage output pulse is limited by the turn-on rate of the SCR's used.

A capacitor 39 is connected across the output terminal 15. Capacitance 39 is a necessary element in the circuit. It may be an integral part of the load connected at 15, or all or part may be added internally to the pulse-generating circuit, as shown.

The timing and triggering circuit 7, shown in FIG. 1 and more detailed in FIG. 2, provides the proper pulse signal into transformer 35 to turn "on" the first SCR. The triggering pulse must be synchronized with the charging voltage applied to the pulse-generating circuit 9 so that no charging voltage is present for the duration of the H.V. pulse output at 15. Synchronizaton is achieved by using the alternating voltage input at 5 as a timing reference for deriving the trigger signal in a timing and triggering circuit 7. The terminals 5 are connected to the primary of an isolation transformer 41 which has its secondary winding connected to the input of another full wave bridge rectifier 43. The output of bridge 43 is connected through a resistor 45 to the input of a monostable multivibrator 47. The diode bridge 43 converts the alternating voltage at the output of transformer 41 into a full wave rectified wave form, which is utilized to trigger the monostable multivibrator 47. The input of multivibrator 47 is connected to ground through a parallel resistor 49 and zener diode 51 network. The purpose of zener diode 51 is to limit the voltage at the input to multivibrator 47. Zener diode 51 is purposely overdriven to provide a clipped full wave rectified sine wave with relative steep rise for triggering multivibrator 47. The multivibrator 47 delivers a narrow pulse to the input of the first one of a plurality of cascaded binary counters 53 through 61. Each counter divides the frequency down by a factor of 2. The output of the multivibrator 47 along with the outputs of counters 53 through 61 is connected to separate terminals of a selector switch 63. Thus, for the number of counter shown, the selector switch may be used to select a pulse rate of 120, 60, 30, 15, 7.5, or 3.75 pulses per second from the 60 Hz frequency input to the transformer 41. It will be obvious to those skilled in the art that various rates may be obtained by using a different counter configuration and different input frequencies. The selected triggering rate, 120 pulses per second, as indicated by the switch 63 position, is coupled from the common terminal of switch 63 to the input of a monostable multivibrator 65. Multivibrator 65 develops a short duration pulse which is applied through a driver 67 to the primary of the pulse transformer 35 of the pulse-generating circuit 9.

As pointed out above, an optional charging initiation control circuit 13 may be employed to increase the efficiency of the charging circuit 11. When the alternate circuit 13 is employed, the jumper between terminals C and D in the charging circuit is removed and the terminals are connected to corresponding C and D terminals of the optional charging initiation circuit 13. The zener diode 23 is removed and a shorting strap is connected in its place. A delay circuit 69, which may be a one-shot, is connected to the output of multivibrator 65 in the timing and triggering circuit 7. Delay circuit 69 delays the pulse from multivibrator 65 to the input of a monostable multivibrator 71 connected to the output of delay circuit 69. Multivibrator 71 generates a short duration pulse following the delay (T - 1) which is connected to the primary of a pulse transformer 75 through a driver circuit 73. The secondary of the pulse transformer 75 is connected between the gate and cathode electrodes of an SCR 77. In this alternate mode the output of transformer 19 in the charging circuit 11 is switched through SCR 77 to the output of the bridge rectifier 21.

As shown in FIG. 3, (charging voltage alternate No. 2) this mode of operation provides an increase in the charging voltage to the pulse-generating circuit 9 due to the smaller loss through SCR 77. To provide sufficient triggering time that will allow the SCR's in the pulse-generating circuit 9 to turn "off" following the generation of a high voltage pulse, the circuit 13 delays the application of the charging voltage to the pulse-generating circuit 9 for a period T - 1. As shown in FIG. 3, the delay (T - 1) clips the front portion of the signal applied from the output of bridge 21 without a substantial decrease in the amplitude of the signal from bridge 21, as is the case with the zener diode 23 connected in the output to pulse-generating circuit 9. Once the delay circuit 69 times out, the pulse is applied through pulse transformer 75 to the gate of SCR 77 which reconnects the output of bridge 21 to the first network 25. In this mode the loss in amplitude of voltage applied to network 25 is the forward resistance of the SCR 77.

Figure 4:
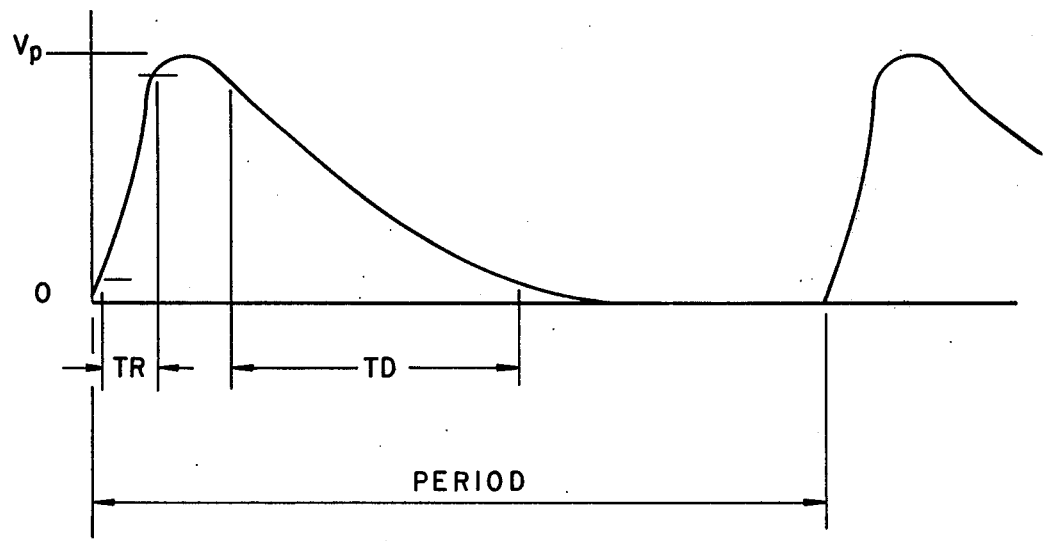
FIG. 4 is a plot of a typical high voltage pulse from the circuit of FIG. 2.

Thus, it will be seen that a very efficient and versatile high voltage pulse generator has been provided in which the high-voltage pulse output may be readily varied in amplitude and repetition rate and requires only standard line voltage, 120 volts, 60 Hz. Using charge storage capacitors $C_1$ through $C_n$ having a capacitance of 0.1 microfarads, the pulses as shown in FIG. 4 having $V_p$ peak equal to N times 500 volts/capacitor C were obtained. Typically, the rise time TR is about 200 nanoseconds and the decay time TD is approximately 18 microseconds. The period between pulses is equal to the reciprocal of the selected repetition rate.

What is claimed is:

1. In a high-voltage pulse generator wherein a plurality of charge-storing capacitors are connected, respectively, in a corresponding plurality of cascaded charging networks so that each capacitor is charged in parallel and subsequently discharged in series to produce a high-voltage pulse, the improvement comprising:
   a plurality of SCR's equal in number to said plurality of charge-storing capacitors, each of said SCR's having an anode, cathode, and gate electrode, all but at least one of said SCR's having their anodes connected to the positive charged side of a corresponding one of said plurality of charge-storing capacitors and their cathodes connected to the negative charged sides of the charge-storing capacitor of the succeeding cascaded network, said last SCR having its anode connected to the positive charged side of the charged-storing capacitor of the last cascaded network and having its cathode connected to an output terminal of said pulse generator;
   a charging circuit means responsive to a fixed frequency alternating reference voltage for applying a pulsating d.c. charging voltage to said charge-storing capacitors of said cascaded network;
   a triggering circuit for providing triggering signals to the gate electrode of a first one of said plurality of SCR's at selected intervals when no charging voltage is being applied to said charge-storing capacitors including a first full wave rectifier connected to receive said alternating voltage signal at an input thereof and producing full wave rectifier pulses at an output thereof, a plurality of cascaded pulse dividers connected to the output of said first rectifier, each divider reducing the pulse rate applied to the input thereof by a factor of two, a selector switch having a plurality of contacts one greater in number than said plurality of dividers, each contact connected to a separate divider output and said one contact connected to receive the output pulses from said first rectifier, and output circuit means for connecting the common terminal of said selector switch to the gate of said first SCR so that the high-voltage pulse rate may be selected through said selector switch; and
   a plurality of triggering capacitors connected between the anode and gate electrode, respectively, of the remaining plurality of SCR's so that when a triggering signal is applied to the gate electrode of said first SCR the remaining plurality of SCR's are triggered sequentially to switch said charge-storing capacitors into a series discharge mode, generating a high-voltage pulse at said output terminal.

2. The high-voltage pulse generator as set forth in claim 1 wherein said charging circuit means includes a second full wave rectifier connected to receive said alternating voltage signal at an input thereof and a zener diode connected between the output of said second rectifier and the first one of said cascaded charging networks.

3. The high-voltage pulse generator as set forth in claim 1 wherein said charging circuit means includes a diode bridge full wave rectifier connected to receive said alternating voltage signal at an input thereof, and switching means including a time delay circuit for switching the output of said bridge rectifier to the first one of said cascaded charging networks in response to each trigger pulse from said triggering circuit following a fixed time delay period sufficient to allow said plurality of SCR's of said cascaded charge networks to turn "off."

* * * * *